(12) United States Patent
Chang

(10) Patent No.: US 9,853,647 B2
(45) Date of Patent: *Dec. 26, 2017

(54) TRANSITION ENFORCING CODING RECEIVER FOR SAMPLING VECTOR SIGNALS WITHOUT USING CLOCK AND DATA RECOVERY

(71) Applicant: MEDIATEK INC., Hsin-Chu (TW)

(72) Inventor: Ching-Hsiang Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/005,016

(22) Filed: Jan. 25, 2016

(65) Prior Publication Data

US 2016/0218723 A1    Jul. 28, 2016

Related U.S. Application Data

(60) Provisional application No. 62/108,626, filed on Jan. 28, 2015.

(51) Int. Cl.
| | |
|---|---|
| H03L 7/08 | (2006.01) |
| H04L 25/49 | (2006.01) |
| G06F 13/42 | (2006.01) |
| H04L 25/02 | (2006.01) |
| H03M 5/20 | (2006.01) |

(52) U.S. Cl.
CPC ........ *H03L 7/0807* (2013.01); *G06F 13/4278* (2013.01); *H04L 25/4917* (2013.01); *H03M 5/20* (2013.01); *H04L 25/0292* (2013.01)

(58) Field of Classification Search
CPC .... H03L 7/0807; H03M 5/20; H04L 25/0292; H04L 25/4917
See application file for complete search history.

(56) References Cited

U.S. PATENT DOCUMENTS

| | | | | |
|---|---|---|---|---|
| 7,126,408 | B2 * | 10/2006 | Zerbe | G11C 7/02 327/336 |
| 8,718,184 | B1 * | 5/2014 | Cronie | G06F 13/42 341/50 |
| 2009/0027093 | A1 | 1/2009 | Chen | |
| 2011/0029803 | A1 * | 2/2011 | Redman-White | G06F 1/12 713/502 |
| 2011/0084863 | A1 | 4/2011 | Chiu | |
| 2014/0286466 | A1 * | 9/2014 | Sengoku | H03K 3/017 375/354 |
| 2016/0359500 | A1 | 12/2016 | Lesso | |
| 2017/0097655 | A1 | 4/2017 | Jeon | |

FOREIGN PATENT DOCUMENTS

TW      EP 3051424 A1 *  8/2016  ......... G06F 13/4278

* cited by examiner

*Primary Examiner* — Ross Varndell
(74) *Attorney, Agent, or Firm* — Winston Hsu

(57) ABSTRACT

A transition enforcing coding (TEC) receiver includes a first delay line circuit, a transition detection circuit, and a data sampling circuit. The first delay line circuit delays a plurality of vector signals to generate a plurality of delayed vector signals, respectively. The transition detection circuit detects a transition of at least one specific delayed vector signal among the delayed vector signals. The data sampling circuit samples the vector signals according to a sampling timing determined based on an output of the transition detection circuit.

20 Claims, 19 Drawing Sheets

TRANSITION ENFORCING CODING RECEIVER FOR SAMPLING VECTOR SIGNALS WITHOUT USING CLOCK AND DATA RECOVERY

CROSS REFERENCE TO RELATED APPLICATIONS

This application claims the benefit of U.S. provisional application No. 62/108,626, filed on Jan. 28, 2015 and incorporated herein by reference.

BACKGROUND

The disclosed embodiments of the present invention relate to data recovery at a receiver, and more particularly, to a transition enforcing coding (TEC) receiver for sampling vector signals without using clock and data recovery (CDR).

Transition enforcing coding (TEC) is a technique used to convert a bit sequence into a plurality of vector signals for transmission and reception between different chips. The TEC makes transition(s) always happen between adjacent states of the vector signals. For example, the vector signals records data bits representative of a current state during a current transmission clock cycle, and records data bits representative of a next state during a next transmission clock cycle, where the data bits representative of the current state and the data bits representative of the next state have at least one bit inversion (e.g., 1→0 or 0→1). The conventional TEC receiver generally has a clock and data recovery (CDR) circuit implemented therein. The CDR circuit is used to adjust the sampling timing for allowing a data sampler to get an optimal setup/hold time margin to sample the received vector signals correctly. However, the CDR circuit will lead to a larger chip area as well as higher power consumption, and will require an extra lock-in time for ensuring correct data sampling. Further, if the TEC transmitter needs to cover a wide range of data rates, the CDR circuit in the TEC receiver needs to be implemented using a wide-range CDR circuit, which results in a higher production cost.

Thus, there is a need for an innovative TEC receiver which is capable of correctly sampling the received vector signals without using any CDR circuit.

SUMMARY

In accordance with exemplary embodiments of the present invention, a transition enforcing coding (TEC) receiver for sampling vector signals without using clock and data recovery (CDR) is proposed.

According to a first aspect of the present invention, an exemplary transition enforcing coding (TEC) receiver is disclosed. The exemplary TEC receiver includes a first delay line circuit, a transition detection circuit, and a data sampling circuit. The first delay line circuit is arranged to delay a plurality of vector signals to generate a plurality of delayed vector signals, respectively. The transition detection circuit is arranged to detect a transition of at least one specific delayed vector signal among the delayed vector signals. The data sampling circuit is arranged to sample the vector signals according to a sampling timing determined based on an output of the transition detection circuit.

According to a second aspect of the present invention, an exemplary transition enforcing coding (TEC) receiver is disclosed. The exemplary TEC receiver includes a transition detection circuit, a delay line circuit, and a data sampling circuit. The transition detection circuit is arranged to detect a transition of at least one specific vector signal among a plurality of vector signals. The delay line circuit is arranged to generate a delayed signal according to an output of the transition detection circuit. The data sampling circuit is arranged to sample the vector signals according to a sampling timing determined based on the delayed signal.

According to a third aspect of the present invention, an exemplary transition enforcing coding (TEC) receiver is disclosed. The exemplary TEC receiver includes a delay line circuit, a transition detection circuit, and a data sampling circuit. The delay line circuit is arranged to delay a plurality of vector signals to generate a plurality of delayed vector signals, respectively. The transition detection circuit is arranged to detect a transition of at least one specific vector signal among the vector signals. The data sampling circuit is arranged to sample the delayed vector signals according to a sampling timing determined based on an output of the transition detection circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
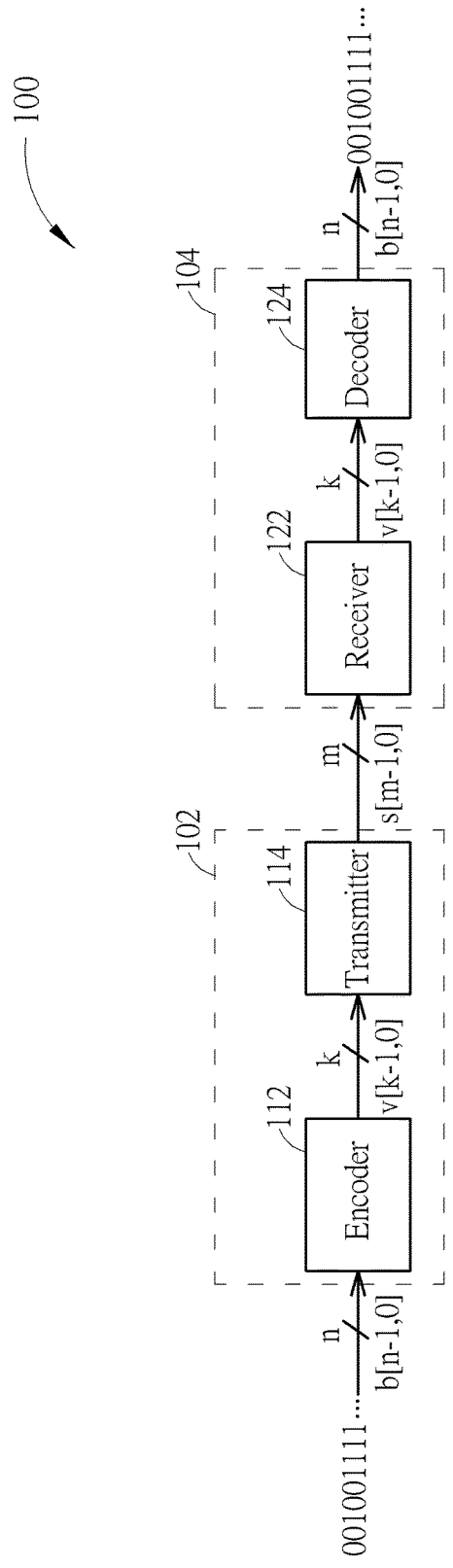
FIG. 1 is a diagram illustrating a communication system according to an embodiment of the present invention.

FIG. 1 is a diagram illustrating a communication system according to an embodiment of the present invention. The communication system 100 includes an encoder 112 and a transmitter 114 located at a first chip 102, and further includes a receiver 122 and a decoder 124 located at a second chip 104. An n-bit binary data b[n−1,0] can be encoded into k vector signals v[k−1,0] by the encoder 112 according to an employed transition enforcing coding (TEC) algorithm. The transmitter 114 has a serializer (not shown) to convert the k vector signals v[k−1,0] into m vector signals s[m−1,0] for high speed data transmission, and then transmits the m vector signals s[m−1,0] from the first chip 102 to the second chip 104 via m parallel channels. The receiver 122 receives the m vector signals s[m−1,0] from m parallel channels, and has a deserializer (not shown) to convert sampled data of the received m vector signals s[m−1,0] into sampled data of k vector signals v[k−1,0]. The decoder 124 can decode the k vector signals v[k−1,0] to recover the n-bit binary data b[n−1,0] according to the employed TEC algorithm. In this embodiment, the receiver 122 employs a proposed TEC receiver structure to generate the sampled data of the m vector signals s[m−1,0] without using a conventional CDR circuit. Further details of the proposed TEC receiver structure are described as below.

Figure 2:
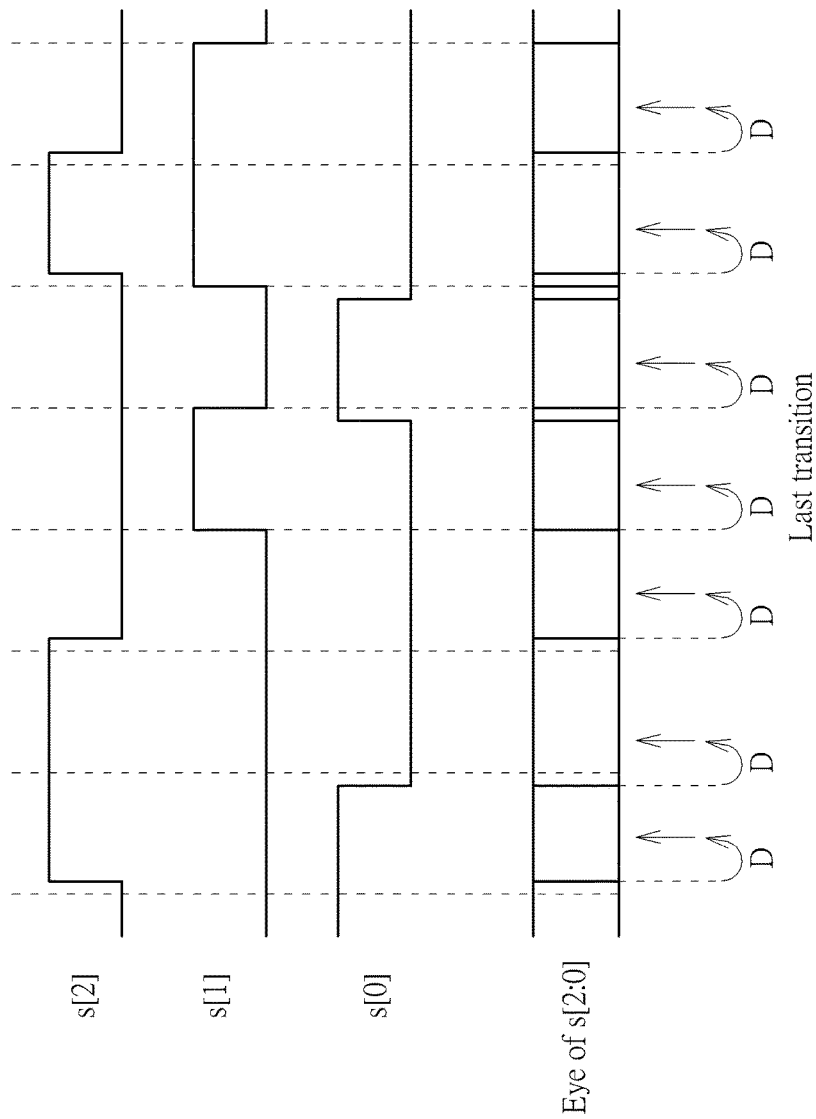
FIG. 2 is a diagram illustrating a first concept of sampling vector signals without using a conventional CDR circuit according to an embodiment of the present invention.

FIG. 2 is a diagram illustrating a first concept of sampling vector signals without using a conventional CDR circuit according to an embodiment of the present invention. Supposing that m=3, three vector signals s[2], s[1] and s[0] are received by a TEC receiver from parallel channels, respectively. As mentioned above, the TEC makes at least one transition always happen between adjacent states of the vector signals. The last transition between the adjacent states (e.g., around an edge of one transmission clock cycle) can be detected. If there is only one transition occurring between adjacent states of the vector signals, this detected transition is regarded as the last transition. If there are multiple transitions occurring between adjacent states of the vector signals, one of the detected transitions that has the last occurrence time is regarded as the last transition. The timing of the detected last transition can be delayed by one predetermined delay time D to be one sampling timing of the vector signals s[2], s[1] and s[0]. As can be seen from the eye diagram of the vector signals s[2], s[1] and s[0], the signal level from the last transition between a current state transition to the first transition between a next state transition is stable and clean. With a proper setting of the predetermined delay time D, the predetermined delay time D can be enough for the setup/hold time margin of a data sampling operation. Hence, data bits representative of one state of the vector signals s[2], s[1] and s[0] can be correctly recovered by the sampling timing determined directly based on a delayed version of the last transition detected between adjacent states.

Figure 3:
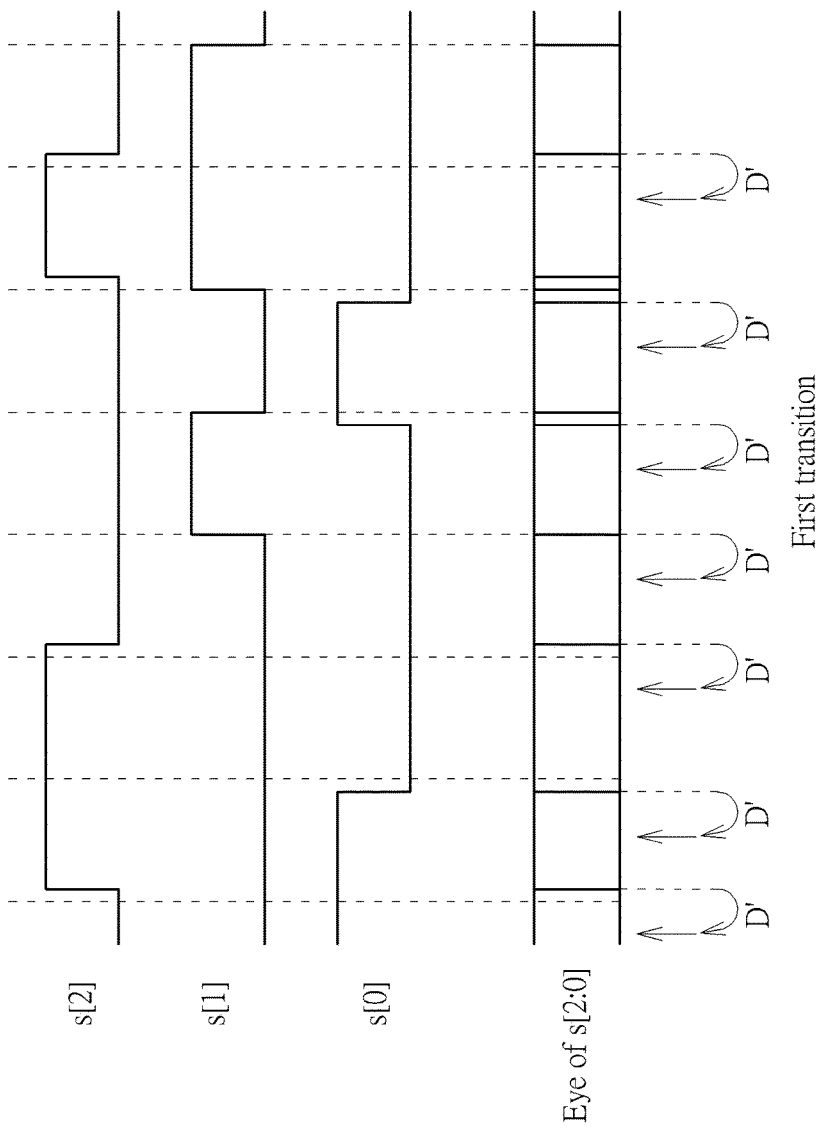
FIG. 3 is a diagram illustrating a second concept of sampling vector signals without using a conventional CDR circuit according to an embodiment of the present invention.

FIG. 3 is a diagram illustrating a second concept of sampling vector signals without using a conventional CDR circuit according to an embodiment of the present invention. Supposing that m=3, three vector signals s[2], s[1] and s[0] are received by a TEC receiver from parallel channels, respectively. As mentioned above, the TEC makes at least one transition always happen between adjacent states of the vector signals. The first transition between the adjacent states (e.g., around an edge of one transmission clock cycle) can be detected. If there is only one transition occurring between adjacent states of the vector signals, this detected transition is regarded as the first transition. If there are multiple transitions occurring between adjacent states of the vector signals, one of the detected transitions that has the first occurrence time is regarded as the first transition. The timing of the detected first transition can be advanced by one predetermined advance time D' to be one sampling timing of the vector signals s[2], s[1] and s[0]. As can be seen from the eye diagram of the vector signals s[2], s[1] and s[0], the signal level from the first transition between a current state transition to the last transition between a previous state transition is stable and clean. With a proper setting of the predetermined advance time D', the predetermined advance time D' can be enough for the setup/hold time margin of a data sampling operation. Hence, data bits representative of one state of the vector signals s[2], s[1] and s[0] can be correctly recovered by the sampling timing determined directly based on an advanced version of the first transition detected between adjacent states.

The proposed TEC receiver can be configured on the basis of one of the aforementioned concepts shown in FIG. 2 and FIG. 3 to achieve the objective of recovering/sampling correct data without using a conventional CDR circuit. Several exemplary designs of the TEC receiver are discussed as below.

Figure 4:
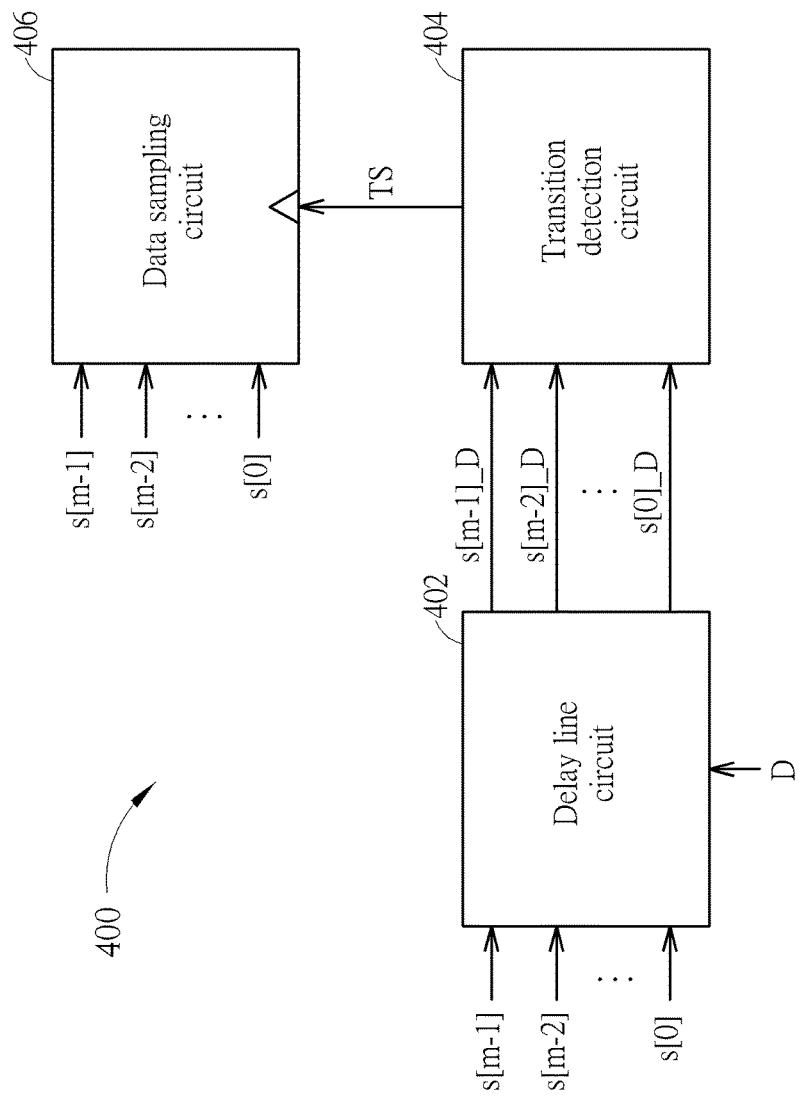
FIG. 4 is a diagram illustrating a TEC receiver according to a first embodiment of the present invention.

FIG. 4 is a diagram illustrating a TEC receiver according to a first embodiment of the present invention. The receiver 122 shown in FIG. 1 may be implemented using the TEC receiver 400 shown in FIG. 4. The TEC receiver 400 includes a delay line circuit 402, a transition detection circuit 404, and a data sampling circuit 406. It should be noted that only the circuit components pertinent to the present invention are shown in FIG. 4. In practice, the TEC receiver 400 may include additional circuit components. For example, the TEC receiver 400 may have at least one deserializer used to further process an output of the data sampling circuit 406.

The delay line circuit 402 is arranged to delay a plurality of vector signals (e.g., m vector signals s[m−1]-s[0]) to generate a plurality of delayed vector signals (e.g., m delayed vector signals s[m−1]_D-s[0]_D), respectively. It should be noted that the delay time D applied to each of the vector signals s[m−1]-s[0] should be enough for a setup/hold time margin of the data sampling circuit 406. In one exemplary design, the same delay time D with a proper setting may be applied to all vector signals. In another exemplary design, different delay times D may be applied to different vector signals for ensuring enough setup/hold time margins for sampling the different vector signals and reducing transition skew between the different vector signals (i.e., aligning transition(s) between adjacent states of the different vector signals).

The transition detection circuit 404 is arranged to detect a transition of at least one specific delayed vector signal among the delayed vector signals s[m−1]_D-s[0]_D. In this embodiment, the transition of the at least one specific delayed vector signal is the last transition detected between adjacent states of the delayed vector signals s[m−1]_D-s[0]_D. It should be noted that the delayed vector signals s[m−1]_D-s[0]_D and the vector signals s[m−1]-s[0] deliver the same data bits but are time-shifted by the delay time D. The data sampling circuit 406 is arranged to sample the vector signals s[m−1]-s[0] according to a sampling timing TS determined based on an output of the transition detection circuit 404. In this embodiment, the TEC receiver 400 determines the sampling timing TS without using clock and data recovery (CDR). For example, the sampling timing TS is directly set by the timing of the transition of the at least one specific delayed vector signal (i.e., timing of the last transition detected between adjacent states).

As mentioned above, the delay line circuit 402 is arranged to delay the vector signals s[m−1]-s[0] for generating delayed vector signals s[m−1]_D-s[0]_D, where the delayed vector signals s[m−1]_D-s[0]_D are used by the transition detection circuit 404 to detect a transition of at least one specific delayed vector signal. Since the delay line circuit 402 is located before the transition detection circuit 404, it is possible to overcome the skew issue among the vector signals s[m−1]-s[0] with certain calibration pattern. Hence, in addition to acting as a delayed vector signal generator, the delay line circuit 402 may be further configured to act as a de-skew circuit for aligning transition(s) between adjacent states of the vector signals s[m−1]-s[0]. In this way, the vector signals s[m−1]-s[0] are de-skewed and delayed by the same delay line circuit 402.

Figure 5:
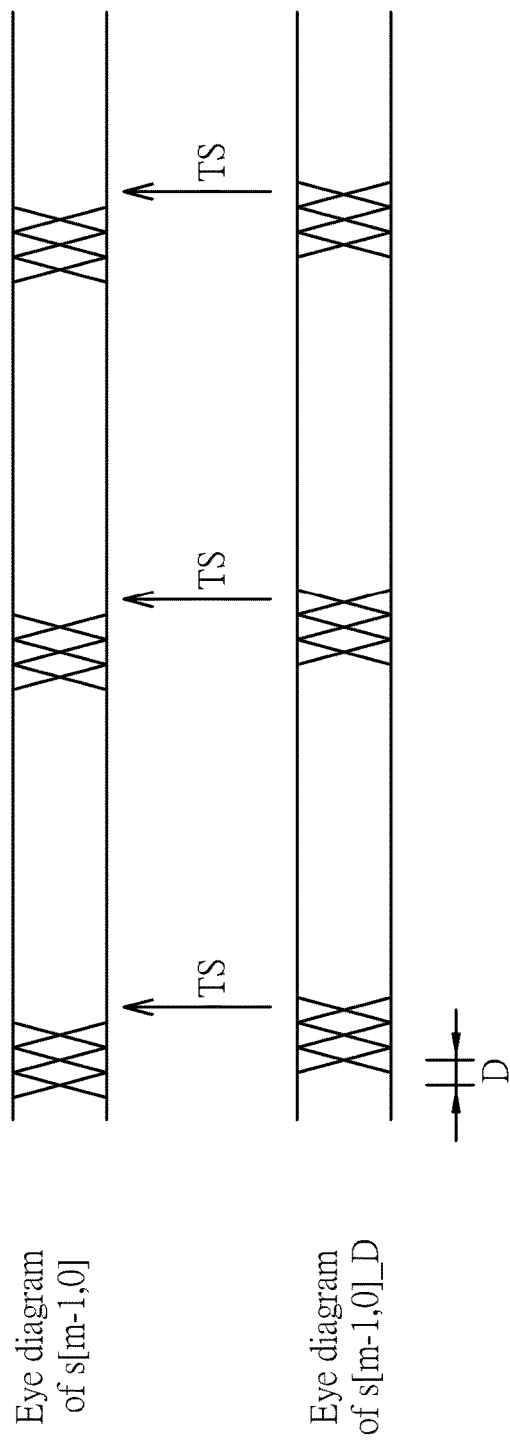
FIG. 5 is a diagram illustrating an example of a data sampling operation performed by the TEC receiver shown in FIG. 4.

FIG. 5 is a diagram illustrating an example of a data sampling operation performed by the TEC receiver 400 shown in FIG. 4. The TEC receiver 400 may be configured on the basis of the concept shown in FIG. 2. The delayed vector signals s[m−1]_D-s[0]_D are checked by the transition detection circuit 404 to find the last transition between adjacent states. The timing of the last transition possessed by at least one of the delayed vector signals s[m−1]_D-s[0]_D is equivalent to a delayed version of the timing of the last transition possessed by at least one of the vector signals s[m−1]-s[0]. Hence, the timing of the last transition possessed by at least one of the delayed vector signals s[m−1]_D-s[0]_D can be directly used as the sampling timing TS of the data sampling circuit 406 for getting sampled data from the vector signals s[m−1]-s[0].

Figure 6:
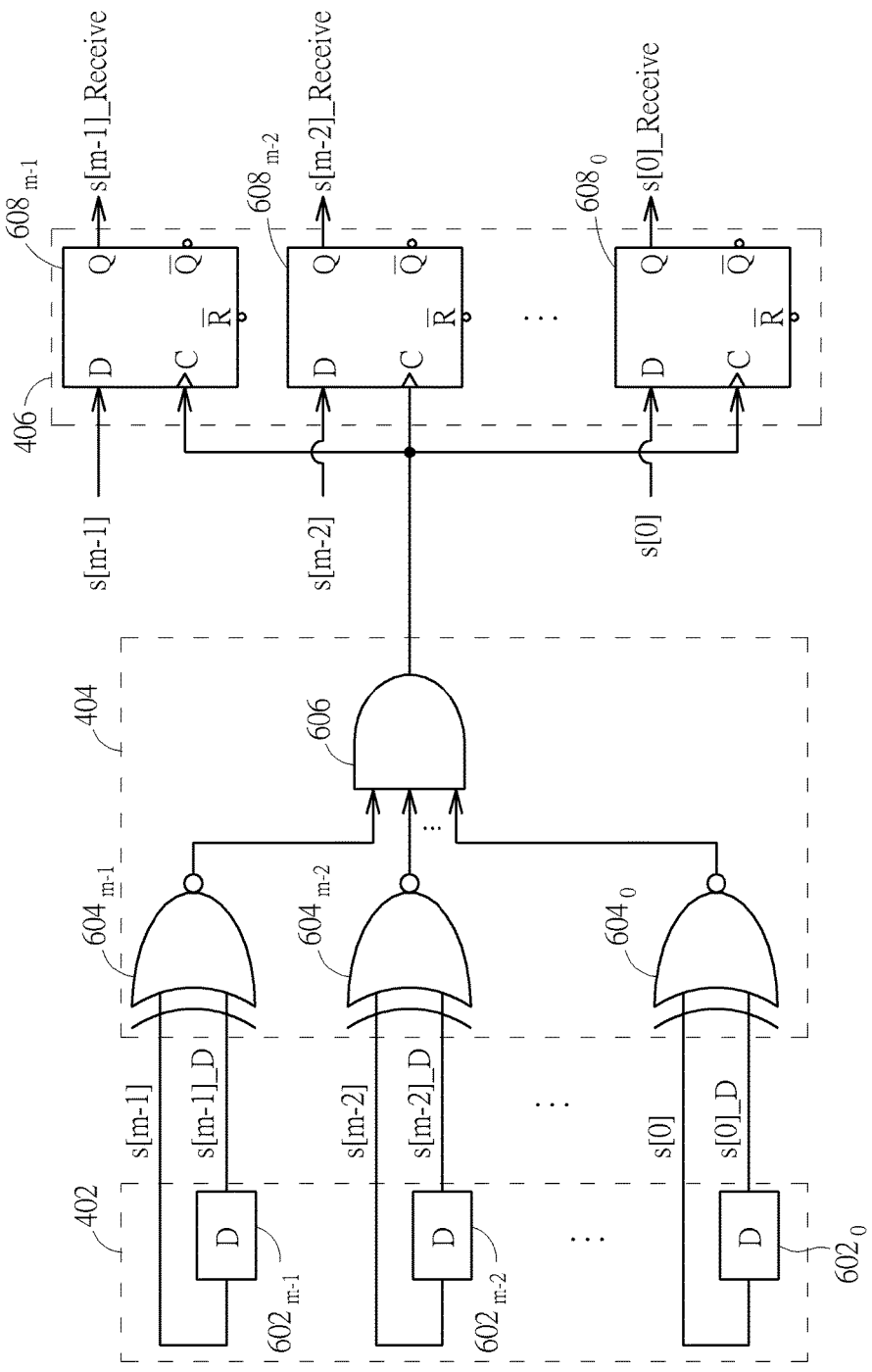
FIG. 6 is a diagram illustrating one circuit implementation of the TEC receiver shown in FIG. 4 according to an embodiment of the present invention.

FIG. 6 is a diagram illustrating one circuit implementation of the TEC receiver 400 shown in FIG. 4 according to an embodiment of the present invention. As shown in FIG. 6, the delay line circuit 402 includes a plurality of delay lines (denoted by "D") $602_0$-$602_{m-1}$ used for generating the delayed vector signals s[0]_D-s[m−1]_D according to the vector signals s[0]-s[m−1], respectively. The delay time settings employed by the delay lines $602_0$-$602_{m-1}$ may be same or different, depending upon actual design considerations. In this exemplary circuit design, the vector signals s[0]-s[m−1] are supplied to the data sapling circuit 406 as well as the transition detection circuit 404. Hence, besides the delayed vector signals s[0]_D-s[m−1]_D, the vector signals s[0]-s[m−1] are involved in the last transition detection.

The transition detection circuit 404 includes a plurality of logic gates (e.g., exclusive NOR (XNOR) gates) $604_0$-$604_{m-1}$ and one logic gate (e.g., AND gate) 606. In accordance with the logic operations performed by the logic gates $604_0$-$604_{m-1}$ and 606, the output of the transition detection circuit 404 (particularly, the output of the logic gate 606) has a rising edge at the last transition detected between adjacent states of the delayed vector signals s[0]_D-s[m−1]_D. The data sampling circuit 406 includes a plurality of data samplers $608_0$-$608_{m-1}$ implemented using D-type flip flips (DFFs). The data samplers $608_0$-$608_{m-1}$ are clocked by the same rising edge of the output of the transition detection circuit 404 to sample the vector signals s[0]-s[m−1] at the same time, thereby generating sampled data bits s[0]_Receive-s[m−1]_Receive, respectively.

Figure 7:
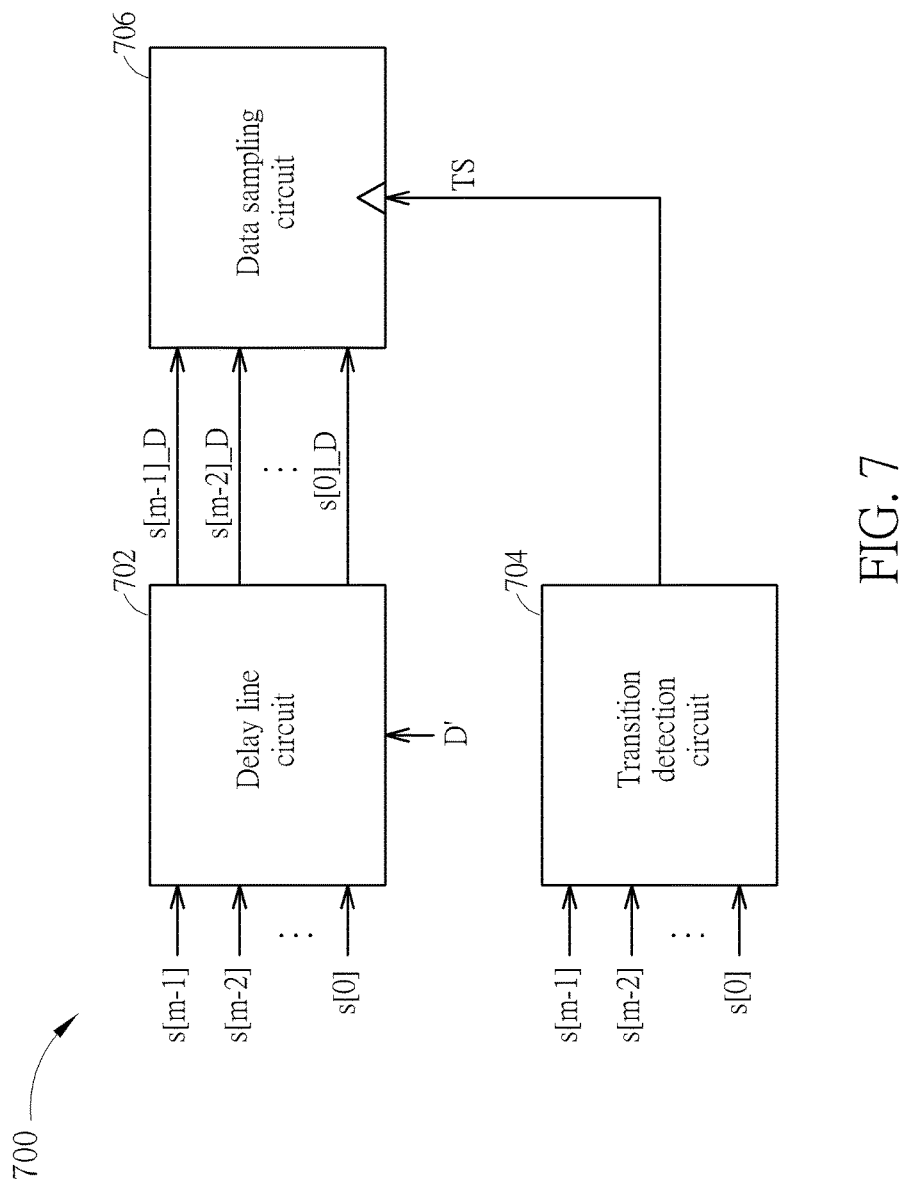
FIG. 7 is a diagram illustrating a TEC receiver according to a second embodiment of the present invention.

FIG. 7 is a diagram illustrating a TEC receiver according to a second embodiment of the present invention. The receiver 122 shown in FIG. 1 may be implemented using the TEC receiver 700 shown in FIG. 7. The TEC receiver 700 includes a delay line circuit 702, a transition detection circuit 704, and a data sampling circuit 706. It should be noted that only the circuit components pertinent to the present invention are shown in FIG. 6. In practice, the TEC receiver 700 may include additional circuit components. For example, the TEC receiver 700 may have at least one deserializer used to further process an output of the data sampling circuit 706.

The delay line circuit 702 is arranged to delay a plurality of vector signals (e.g., m vector signals s[m−1]-s[0]) to generate a plurality of delayed vector signals (e.g., m delayed vector signals s[m−1]_D-s[0]_D), respectively. It should be noted that the delay time D' should be enough for a setup/hold time margin of the data sampling circuit 406. In one exemplary design, the same delay time D' with a proper setting may be applied to all vector signals. In another exemplary design, different delay times D' may be applied to different vector signals for ensuring enough setup/hold time margins for sampling the different vector signals and reducing transition skew between the different vector signals.

The transition detection circuit 704 is arranged to detect a transition of at least one specific vector signal among the vector signals s[m−1]-s[0]. In this embodiment, the transition of the at least one specific vector signal is the first transition detected between adjacent states of the vector signals s[m−1]-s[0]. The data sampling circuit 706 is arranged to sample the delayed vector signals s[m−1]_D-s[0]_D according to a sampling timing TS determined based on an output of the transition detection circuit 704. In this embodiment, the TEC receiver 700 determines the sampling timing TS without using clock and data recovery (CDR). For example, the sampling timing TS is directly set by the timing of the transition of the at least one specific vector signal (i.e., timing of the first transition detected between adjacent states).

Figure 8:
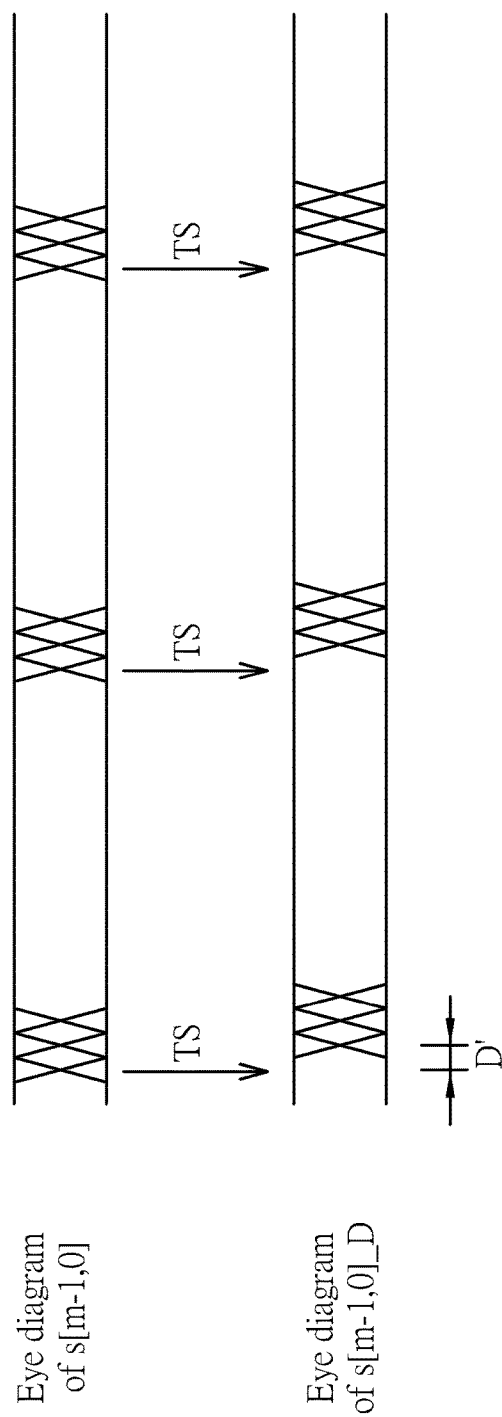
FIG. 8 is a diagram illustrating an example of a data sampling operation performed by the TEC receiver shown in FIG. 7.

FIG. 8 is a diagram illustrating an example of a data sampling operation performed by the TEC receiver 700 shown in FIG. 7. The TEC receiver 700 may be configured on the basis of the concept shown in FIG. 3. The vector signals s[m−1]-s[0] are checked by the transition detection circuit 704 to find the first transition between adjacent states. Since the vector signals s[m−1]-s[0] are delayed for following data sampling at the data sampling circuit 706, the timing of the first transition possessed by one of the vector signals s[m−1]-s[0] that is referenced for sampling the delayed vector signals s[m−1]_D-s[0]_D is equivalent to an advanced version of the timing of the first transition possessed by one of the vector signals $s[m-1]$-$s[0]$ that is referenced for sampling the vector signals $s[m-1]$-$s[0]$. Hence, the timing of the first transition possessed by at least one of the vector signals $s[m-1]$-$s[0]$ can be directly used as the sampling timing TS of the data sampling circuit 406 for getting sampled data from the delayed vector signals $s[m-1]\_D$-$s[0]\_D$, where the delayed vector signals $s[m-1]\_D$-$s[0]\_D$ is a delayed version of the vector signals $s[m-1]$-$s[0]$, and therefore have the same data bits transmitted via the vector signals $s[m-1]$-$s[0]$.

Figure 9:
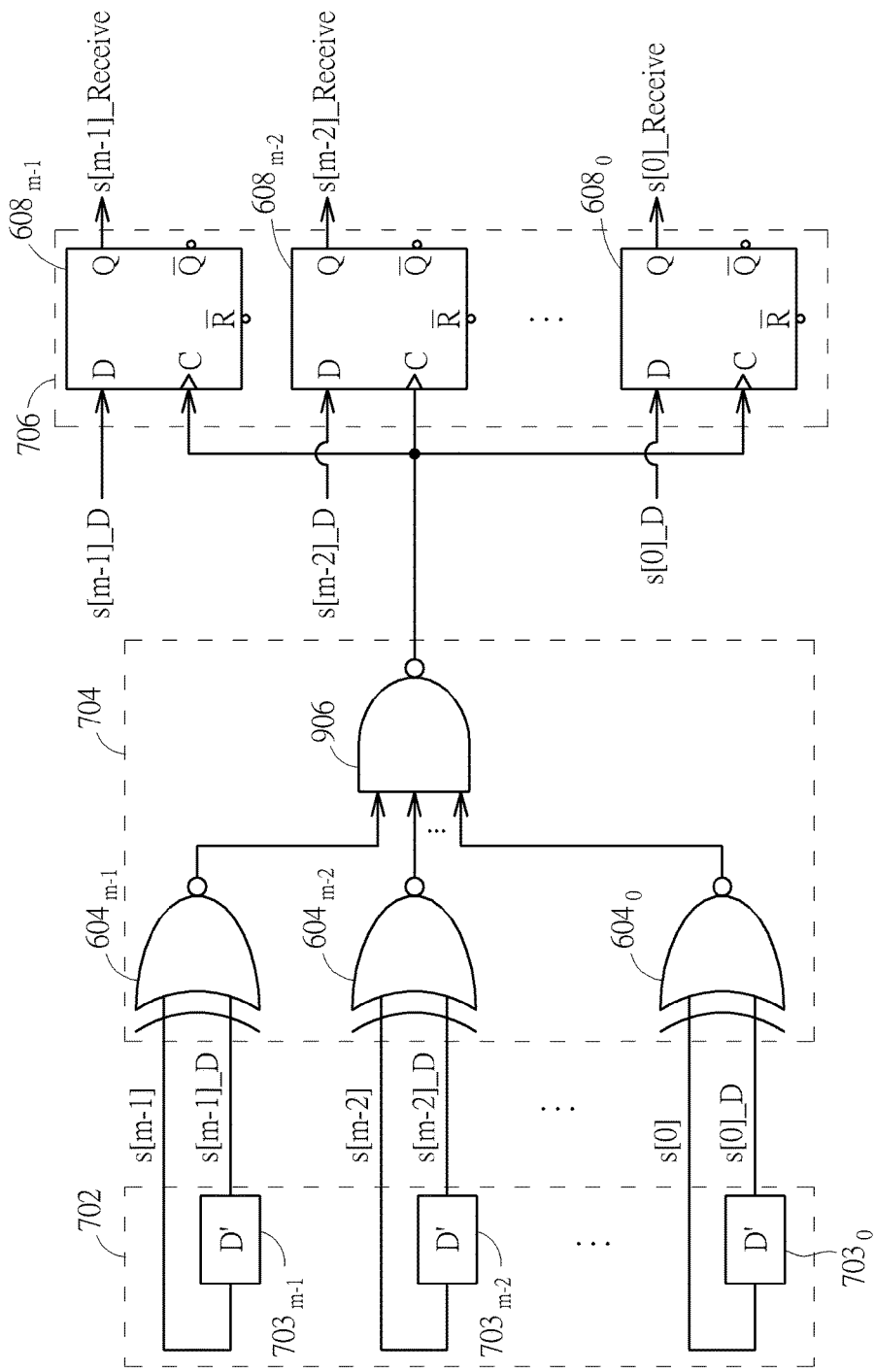
FIG. 9 is a diagram illustrating one circuit implementation of the TEC receiver shown in FIG. 7 according to an embodiment of the present invention.

FIG. 9 is a diagram illustrating one circuit implementation of the TEC receiver 700 shown in FIG. 7 according to an embodiment of the present invention. As shown in FIG. 9, the delay line circuit 702 includes a plurality of delay lines (denoted by "D") $703_0$-$703_{m-1}$ used for generating the delayed vector signals $s[0]\_D$-$s[m-1]\_D$ according to the vector signals $s[0]$-$s[m-1]$, respectively. It should be noted that the delay time settings employed by the delay lines $703_0$-$703_{m-1}$ may be same or different, depending upon actual design considerations. The delayed vector signals $s[0]\_D$-$s[m-1]\_D$ are supplied to the data sampling circuit 706 as well as the transition detection circuit 704. Hence, besides the vector signals $s[0]$-$s[m-1]$, the delayed vector signals $s[0]\_D$-$s[m-1]\_D$ are involved in the first transition detection.

The transition detection circuit 704 includes logic gates (e.g., XNOR gates) $604_0$-$604_{m-1}$ and one logic gate (e.g., NAND gate) 906. In accordance with the logic operations performed by the logic gates $604_0$-$604_{m-1}$ and 906, the output of the transition detection circuit 704 (particularly, the output of the logic gate 906) has a rising edge at the first transition detected between adjacent states of the vector signals $s[0]$-$s[m-1]$. The data sampling circuit 706 includes a plurality of data samplers $608_0$-$608_{m-1}$ implemented using DFFs. The data samplers $608_0$-$608_{m-1}$ are clocked by the same rising edge of the output of the transition detection circuit 704 to sample the vector signals $s[0]$-$s[m-1]$ at the same time, thereby generating sampled data bits $s[0]$ Receive-$s[m-1]$ Receive, respectively.

As shown in each of FIG. 6 and FIG. 9, the logic gate 606/906 is responsible for driving clock input nodes of all data samplers $608_0$-$608_{m-1}$. The pulse width is short when the data rate is high. In a case when the data samplers $608_0$-$608_{m-1}$ are operated in a full-rate clock domain, the logic gate 606/906 may have difficulty in doing the task of driving clock input nodes of all data samplers $608_0$-$608_{m-1}$ in a short time, and/or may consume large power to accomplish the task of driving clock input nodes of all data samplers $608_0$-$608_{m-1}$ in a short time. To relax the driving requirement of the logic gate 606/906, the present invention proposes a power-efficient TEC receiver design with clock generation and associated deserialization (e.g., 1-to-2 deserialization).

Figure 10:
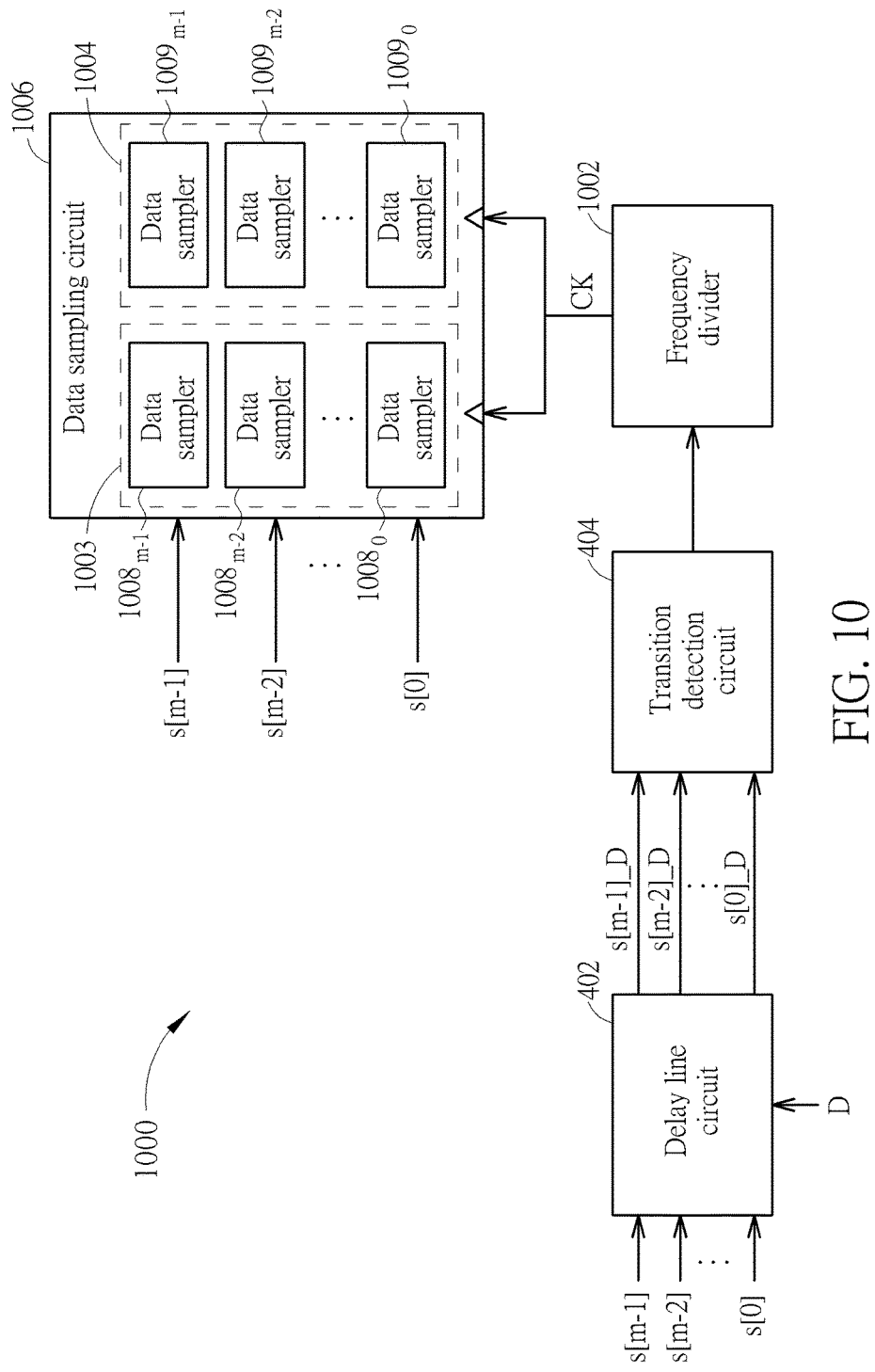
FIG. 10 is a diagram illustrating a TEC receiver according to a third embodiment of the present invention.

FIG. 10 is a diagram illustrating a TEC receiver according to a third embodiment of the present invention. The major difference between the TEC receivers 400 and 1000 is that the TEC receiver 1000 further has a frequency divider 1002 configured to drive the data sampling circuit 1006 with a plurality of data sampler groups (e.g., a first data sampler group 1003 and a second data sampler group 1004). In this embodiment, the first data sampler group 1003 is composed of a plurality of data samples $1008_0$-$1008_{m-1}$, and the second data sampler group 1004 is composed of a plurality of data samples $1009_0$-$1009_{m-1}$. The frequency divider 1002 is arranged to perform frequency division upon the output of the transition detection circuit 404 to generate a clock signal CK to the data sampling circuit 1006. For example, the frequency divider 1002 may be implemented using a divide-by-2 counter, such that an input of the frequency divider 1002 may be operated in a full-rate clock domain and an output of the frequency divider 1002 may be operated in a half-rate clock domain. Though the pulse width of the output of the transition detection circuit 404 is short, the duty cycle of the clock signal CK may be equal to or close to 50% due to inherent characteristics of the divide-by-2 counter. In this embodiment, the first data sampler group 1003 may be designed to be clocked by a rising edge of the clock signal CK, and the second data sampler group 1004 may be designed to be clocked by a falling edge of the clock signal CK. Hence, the data samplers $1008_0$-$1008_{m-1}$ are arranged to sample the vector signals $s[0]$-$s[m-1]$ according to the rising edge of the clock signal CK, respectively; and the data samplers $1009_0$-$1009_{m-1}$ are arranged to sample the vector signals $s[0]$-$s[m-1]$ according to the falling edge of the clock signal CK, respectively.

Compared to the output of the transition detection circuit 404, the clock signal CK has a lower clock rate and a longer logic-high/logic-low width. The frequency divider 1002 is used to drive the data sampling circuit 1006 on behalf of the transition detection circuit 404. Compared to the transition detection circuit 404, the frequency divider 1002 has a relaxed driving requirement when driving all data samples $1008_0$-$1008_{m-1}$ (or $1009_0$-$1009_{m-1}$) at the same time. Since the output of the transition detection circuit 404 needs to drive the frequency divider 1002 only, the driving requirement of the transition detection circuit 404 can be relaxed. Further, since the first data sampler group 1003 and the second data sampler group 1004 are clocked by the rising edge and the falling edge of the clock signal CK, respectively and alternatively, 1-to-2 deserialization is also achieved by the data sampling circuit 1006.

Figure 11:
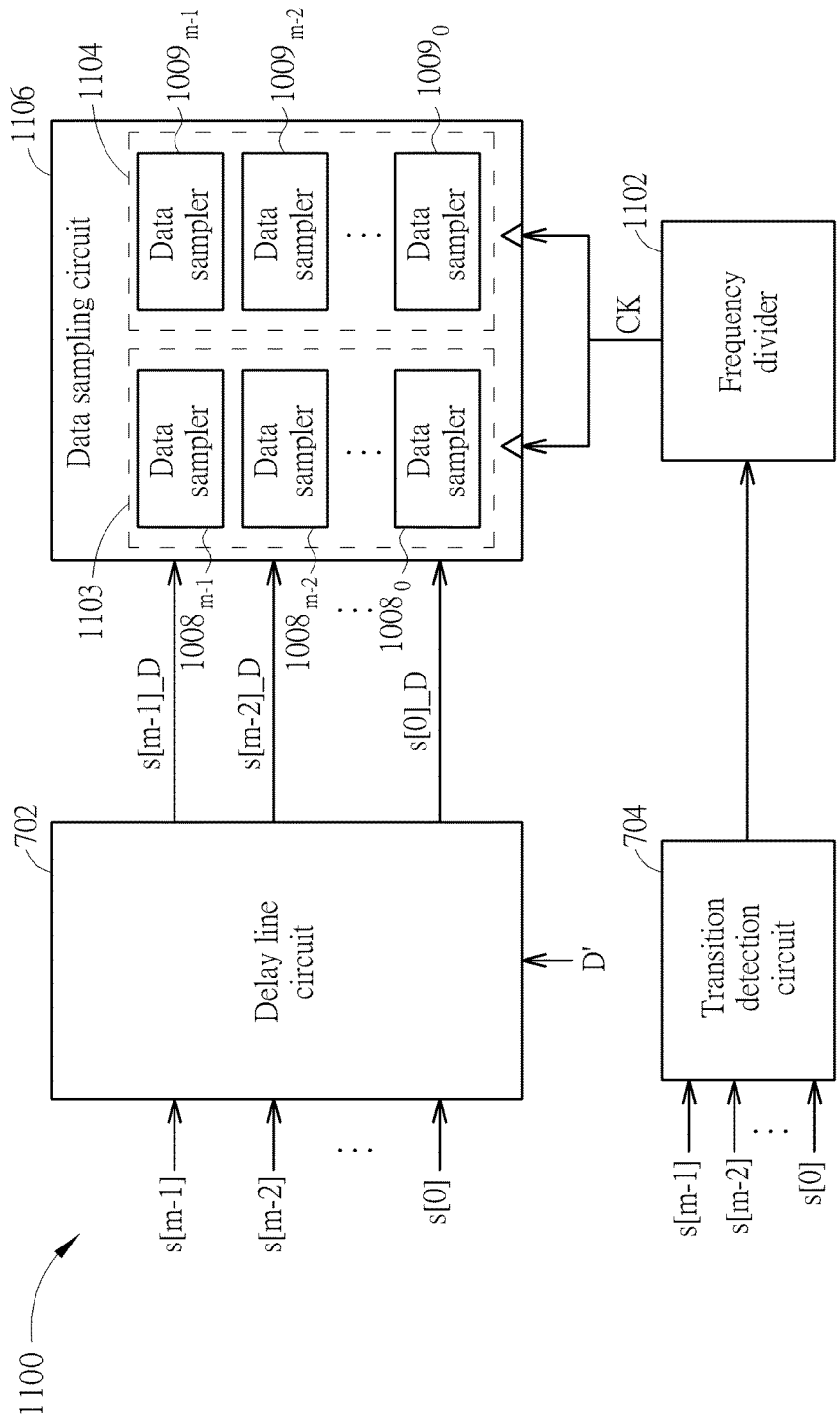
FIG. 11 is a diagram illustrating a TEC receiver according to a fourth embodiment of the present invention.

FIG. 11 is a diagram illustrating a TEC receiver according to a fourth embodiment of the present invention. The major difference between the TEC receivers 700 and 1100 is that the TEC receiver 1100 further has a frequency divider 1102 configured to drive a data sampling circuit 1106 with a plurality of data sampler groups (e.g., a first data sampler group 1103 and a second data sampler group 1104). In this embodiment, the first data sampler group 1103 is composed of a plurality of data samples $1108_0$-$1108_{m-1}$, and the second data sampler group 1104 is composed of a plurality of data samples $1109_0$-$1109_{m-1}$. The frequency divider 1102 is arranged to perform frequency division upon the output of the transition detection circuit 704 to generate a clock signal CK to the data sampling circuit 1106. For example, the frequency divider 1102 may be implemented using a divide-by-2 counter, such that an input of the frequency divider 1002 may be operated in a full-rate clock domain and an output of the frequency divider 1002 may be operated in a half-rate clock domain. Though the pulse width of the output of the transition detection circuit 704 is short, the duty cycle of the clock signal CK may be equal to or close to 50% due to inherent characteristics of the divide-by-2 counter. In this embodiment, the first data sampler group 1103 may be clocked by a rising edge of the clock signal CK, and the second data sampler group 1104 may be clocked by a falling edge of the clock signal CK. Hence, the data samplers $1108_0$-$1108_{m-1}$ are arranged to sample the delayed vector signals $s[0]\_D$-$s[m-1]\_D$ according to the rising edge of the clock signal CK, respectively; and the data samplers $1109_0$-$1109_{m-1}$ are arranged to sample the delayed vector signals $s[0]\_D$-$s[m-1]\_D$ according to the falling edge of the clock signal CK, respectively.

Compared to the output of the transition detection circuit 704, the clock signal CK has a lower clock rate and a longer logic-high/logic-low width. The frequency divider 1102 is used to drive the data sampling circuit 1106 on behalf of the transition detection circuit 704. Compared to the transition detection circuit 704, the frequency divider 1102 has a relaxed driving requirement when driving all data samples 1108$_0$-1108$_{m-1}$ (or 1109$_0$-1109$_{m-1}$) at the same time. Since the output of the transition detection circuit 704 needs to drive the frequency divider 1102 only, the driving requirement of the transition detection circuit 704 can be relaxed. Further, since the first data sampler group 1103 and the second data sampler group 1104 are clocked by the rising edge and the falling edge of the clock signal CK, respectively and alternatively, 1-to-2 deserialization is also achieved by the data sampling circuit 1106.

Figure 12:
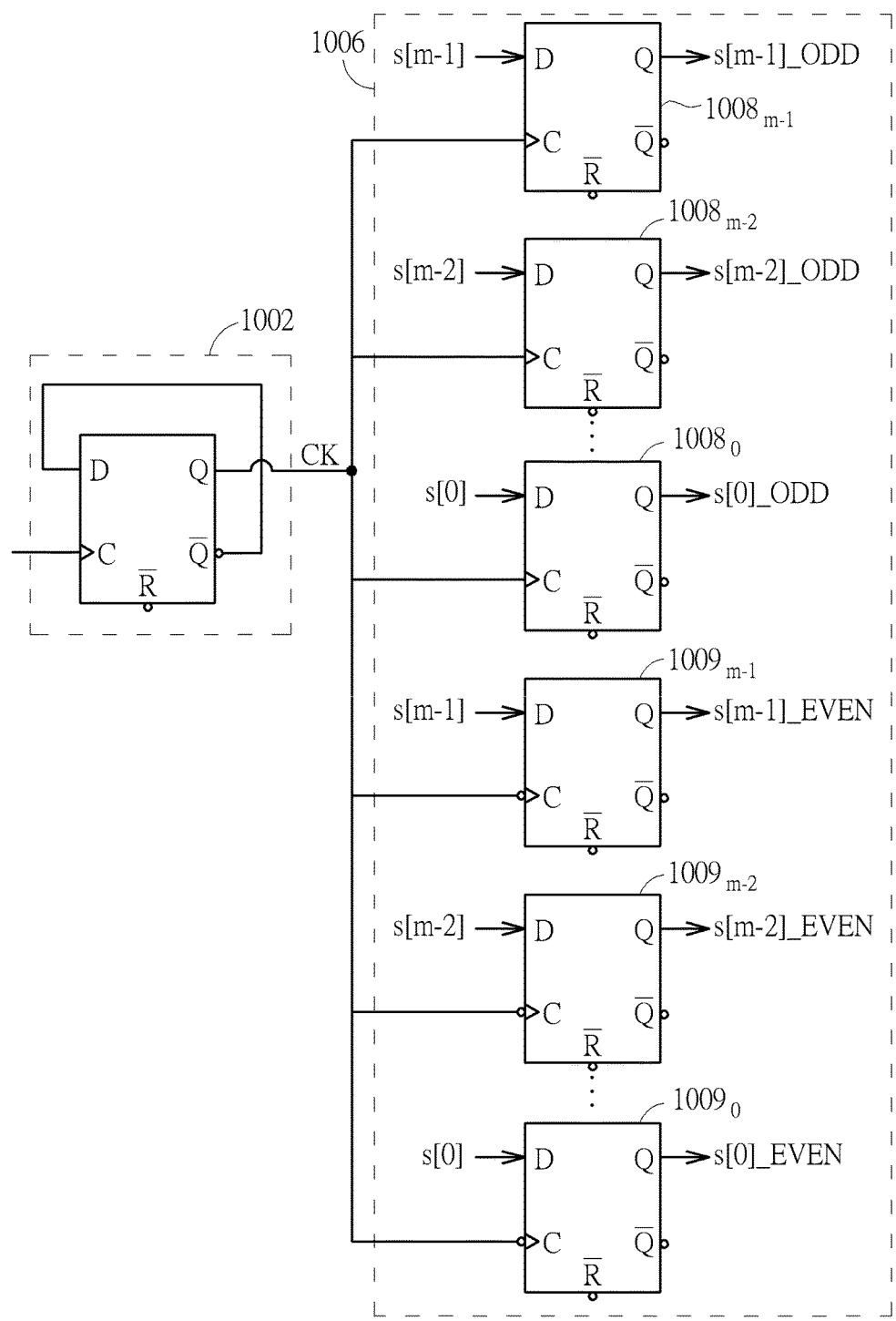
FIG. 12 is a diagram illustrating one circuit implementation of the frequency divider and the data sampling circuit shown in FIG. 10 according to an embodiment of the present invention.

FIG. 12 is a diagram illustrating one circuit implementation of the frequency divider 1002 and the data sampling circuit 1006 shown in FIG. 10 according to an embodiment of the present invention. In this embodiment, the frequency divider 1002 is implemented by configuring a DFF as a divide-by-2 counter. The data samplers 1008$_0$-1008$_{m-1}$ are implemented using DFFs clocked by the rising edge of the clock signal CK to sample the vector signals s[0]-s[m−1] for generating sampled data bits s[0]_ODD-s[m−1]_ODD, respectively. The data samplers 1009$_0$-1009$_{m-1}$ are implemented using DFFs clocked by the falling edge of the clock signal CK to sample the vector signals s[0]-s[m−1] for generating sampled data bits s[0]_EVEN-s[m−1]_EVEN, respectively.

Figure 13:
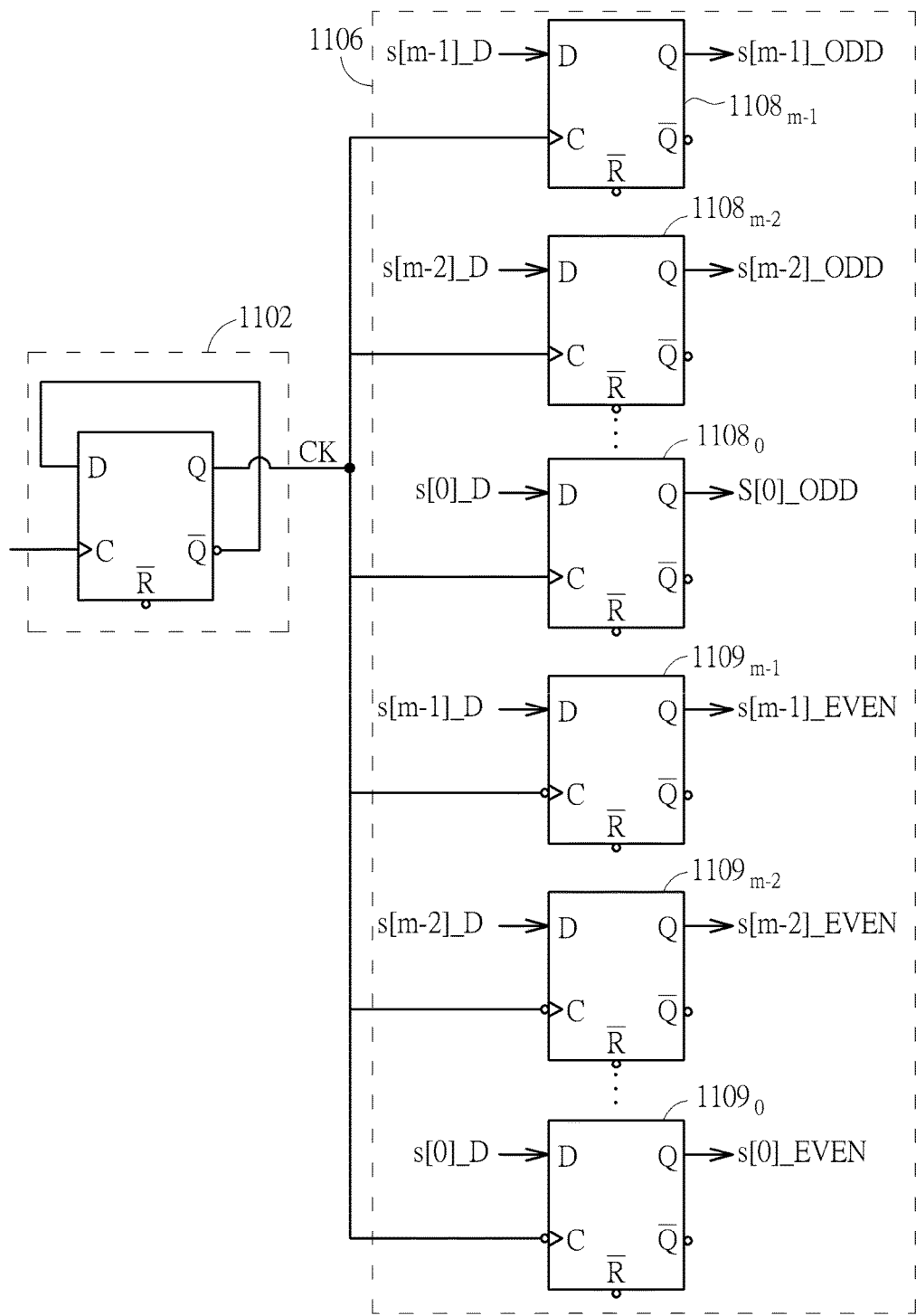
FIG. 13 is a diagram illustrating one circuit implementation of the frequency divider and the data sampling circuit shown in FIG. 11 according to an embodiment of the present invention.

FIG. 13 is a diagram illustrating one circuit implementation of the frequency divider 1102 and the data sampling circuit 1106 shown in FIG. 11 according to an embodiment of the present invention. In this embodiment, the frequency divider 1102 is implemented by configuring a DFF as a divide-by-2 counter. The data samplers 1108$_0$-1108$_{m-1}$ are implemented using DFFs clocked by the rising edge of the clock signal CK to sample the delayed vector signals s[0]_D-s[m−1]_D for generating sampled data bits s[0]_ODD-s[m−1]_ODD, respectively. The data samplers 1109$_0$-1109$_{m-1}$ are implemented using DFFs clocked by the falling edge of the clock signal CK to sample the delayed vector signals s[0]_D-s[m−1]_D for generating sampled data bits s[0]_EVEN-s[m−1]_EVEN, respectively.

With regard to the TEC receiver 400 shown in FIG. 4, the vector signals are first delayed by the delay line circuit 402 and then processed by the transition detection circuit 404 for last transition detection. In addition, the same delay line circuit is used to delay data and transition. However, these are for illustrative purposes only, and are not meant to be limitations of the present invention. The same concept shown in FIG. 2 may be achieved by applying appropriate modifications to the TEC receiver 400 shown in FIG. 4. Further details are described as below.

Figure 14:
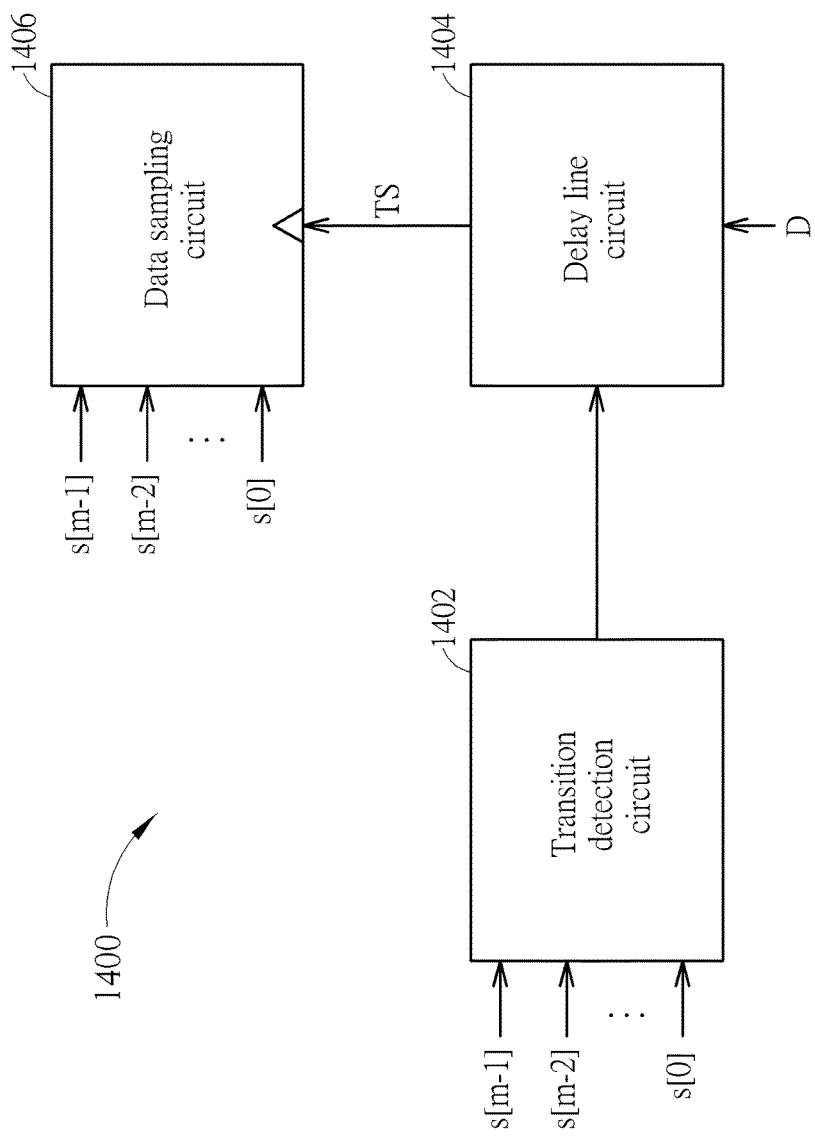
FIG. 14 is a diagram illustrating a TEC receiver according to a fifth embodiment of the present invention.

FIG. 14 is a diagram illustrating a TEC receiver according to a fifth embodiment of the present invention. The receiver 122 shown in FIG. 1 may be implemented using the TEC receiver 1400 shown in FIG. 14. The TEC receiver 1400 includes a transition detection circuit 1402, a delay line circuit 1404, and a data sampling circuit 1406. It should be noted that only the circuit components pertinent to the present invention are shown in FIG. 14. In practice, the TEC receiver 1400 may include additional circuit components. For example, the TEC receiver 1400 may have at least one deserializer used to further process an output of the data sampling circuit 1406.

The TEC receiver 1400 can be obtained by interchanging the transition detection circuit 404 and the delay line circuit 402 shown in FIG. 4. Hence, concerning the TEC receiver 1400 shown in FIG. 14, the transition detection circuit 1402 is arranged to detect a transition of at least one specific vector signal among the vector signals s[m−1]-s[0]. In this embodiment, the transition of the at least one specific vector signal is the last transition detected between adjacent states of the vector signals s[m−1]-s[0]. The delay line 1404 is arranged to generate a delayed signal according to the output of the transition detection circuit 1402, where the delay time D should be enough for a setup/hold time margin of the data sampling circuit 1406. The data sampling circuit 1406 is arranged to sample the vector signals s[m−1]-s[0] according to a sampling timing TS determined based on the delayed signal generated from the delay line circuit 1404. In this embodiment, the TEC receiver 1400 determines the sampling timing TS without using clock and data recovery (CDR). For example, the sampling timing TS is directly set by the timing of the intentionally delayed transition of the at least one specific vector signal (i.e., timing of the intentionally delayed last transition).

Figure 15:
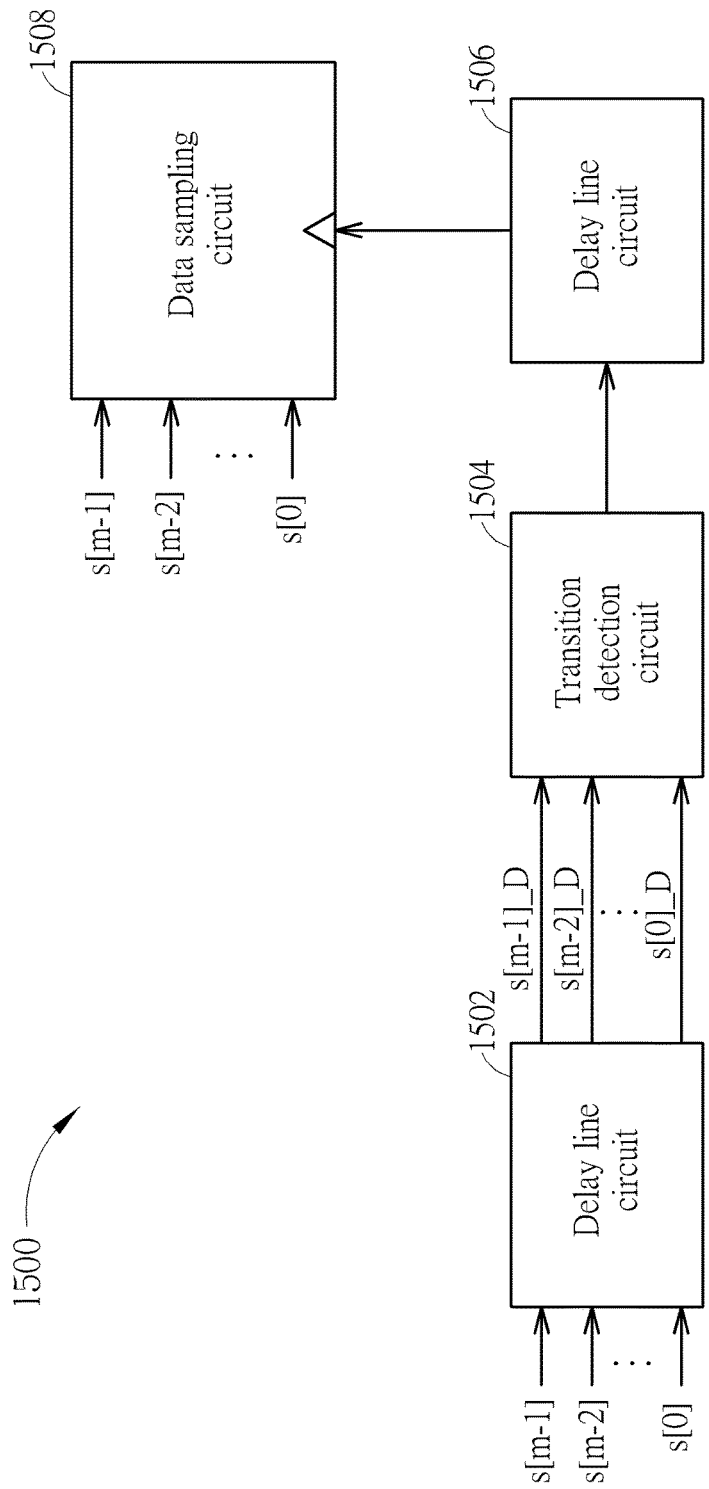
FIG. 15 is a diagram illustrating a TEC receiver according to a sixth embodiment of the present invention.

FIG. 15 is a diagram illustrating a TEC receiver according to a sixth embodiment of the present invention. The receiver 122 shown in FIG. 1 may be implemented using the TEC receiver 1500 shown in FIG. 15. The TEC receiver 1500 includes a plurality of delay line circuits 1502 and 1506, one located before a transition detection circuit 1504 and the other located between the transition detection circuit 1504 and a data sampling circuit 1508. It should be noted that only the circuit components pertinent to the present invention are shown in FIG. 15. In practice, the TEC receiver 1500 may include additional circuit components. For example, the TEC receiver 1500 may have at least one deserializer used to further process an output of the data sampling circuit 1508.

In this embodiment, the delay line circuit 1502 is arranged to delay the vector signals s[m−1]-s[0] for generating delayed vector signals s[m−1]_D-s[0]_D, where the delayed vector signals s[m−1]_D-s[0]_D are used by the transition detection circuit 1504 to detect a transition of at least one specific delayed vector signal. Since the delay line circuit 1502 is located before the transition detection circuit 1504, it is possible to overcome the skew issue among the vector signals s[m−1]-s[0] with certain calibration pattern. In other words, the delay line circuit 1502 may be configured to act as a de-skew circuit for aligning transition(s) between adjacent states of the vector signals s[m−1]-s[0].

In this embodiment, the transition of the at least one specific delayed vector signal is the last transition detected between adjacent states of the delayed vector signals s[m−1]_D-s[0]_D. The other delay line circuit 1506 is arranged to generate a delayed signal according to the output of the transition detection circuit 1504, wherein the sampling timing TS is determined based on the delayed signal. In this embodiment, the TEC receiver 1400 determines the sampling timing TS without using clock and data recovery (CDR). For example, the delay line circuit 1506 is used to delay the timing of the detected last transition for directly setting the sampling timing TS used by the data sampling circuit 1508 to sample the vector signals s[m−1]-s[0].

The feature of using a frequency divider to generate a clock signal with a lower clock rate and a longer period width for relaxing a driving requirement may be incorporated into the TEC receiver 1500 shown in FIG. 15.

Figure 16:
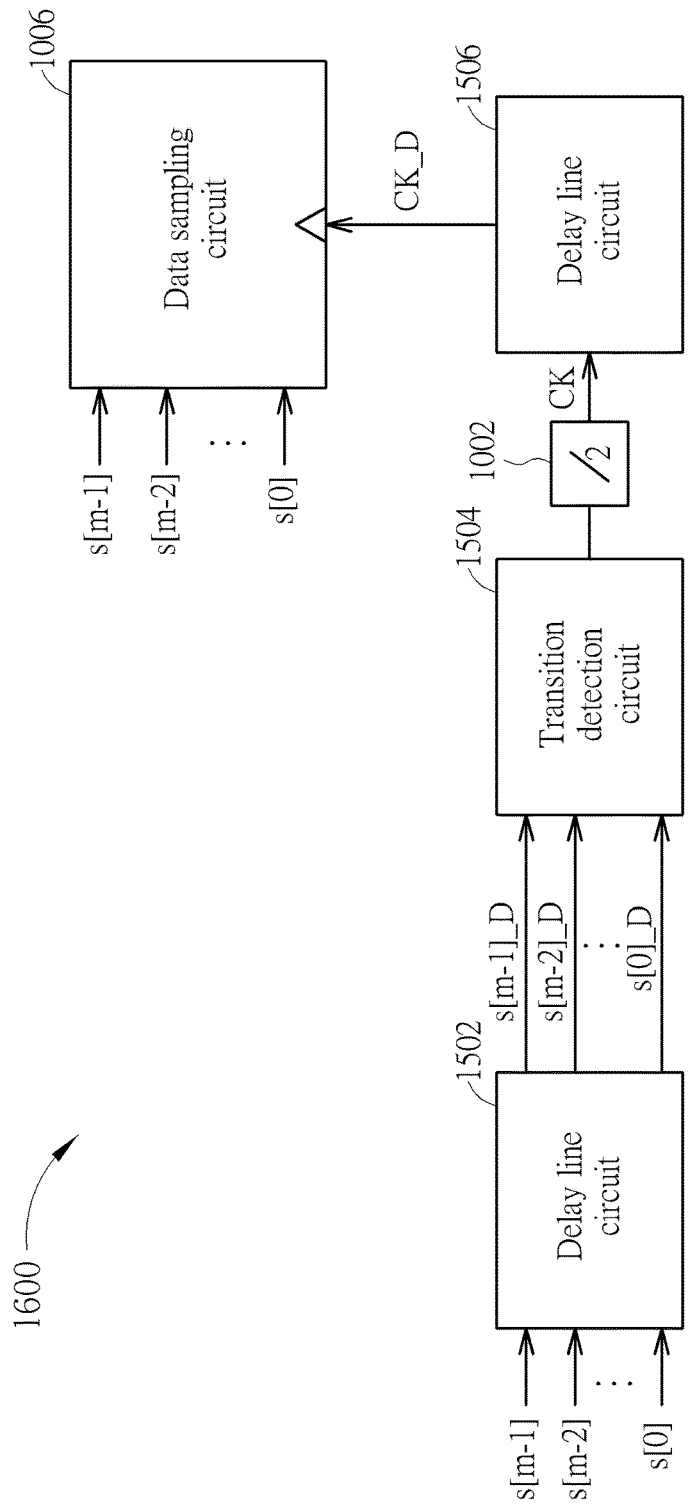
FIG. 16 is a diagram illustrating a TEC receiver according to a seventh embodiment of the present invention.

FIG. 16 is a diagram illustrating a TEC receiver according to a seventh embodiment of the present invention. In this embodiment, the data sampling function may be implemented using the data sampling circuit 1006 shown in FIG. 10, and the frequency divider (e.g., divide-by-2 counter) 1002 may be located between the transition detection circuit 1504 and the delay line circuit 1506. Hence, after the frequency divider 1002 generates the clock signal CK according to the output of the transition detection circuit 1504, the delay line circuit 1506 delays the clock signal CK to generate a delayed clock signal CK_D to the data sampling circuit 1006. Since the delay line circuit 1506 delays the clock signal CK to generate the delayed clock signal CK_D as the delayed signal used to set the sampling timing of the data sampling circuit 1006, the data samplers $1008_0$-$1008_{m-1}$ in the data sampling circuit 1006 are arranged to sample the vector signals s[0]-s[m−1] according to a rising edge of the delayed clock signal CK_D, respectively, and the data samples $1009_0$-$1009_{m-1}$ in the data sampling circuit 1006 are arranged to sample the vector signals s[0]-s[m−1] according to a falling edge of the delayed clock signal CK_D, respectively.

Figure 17:
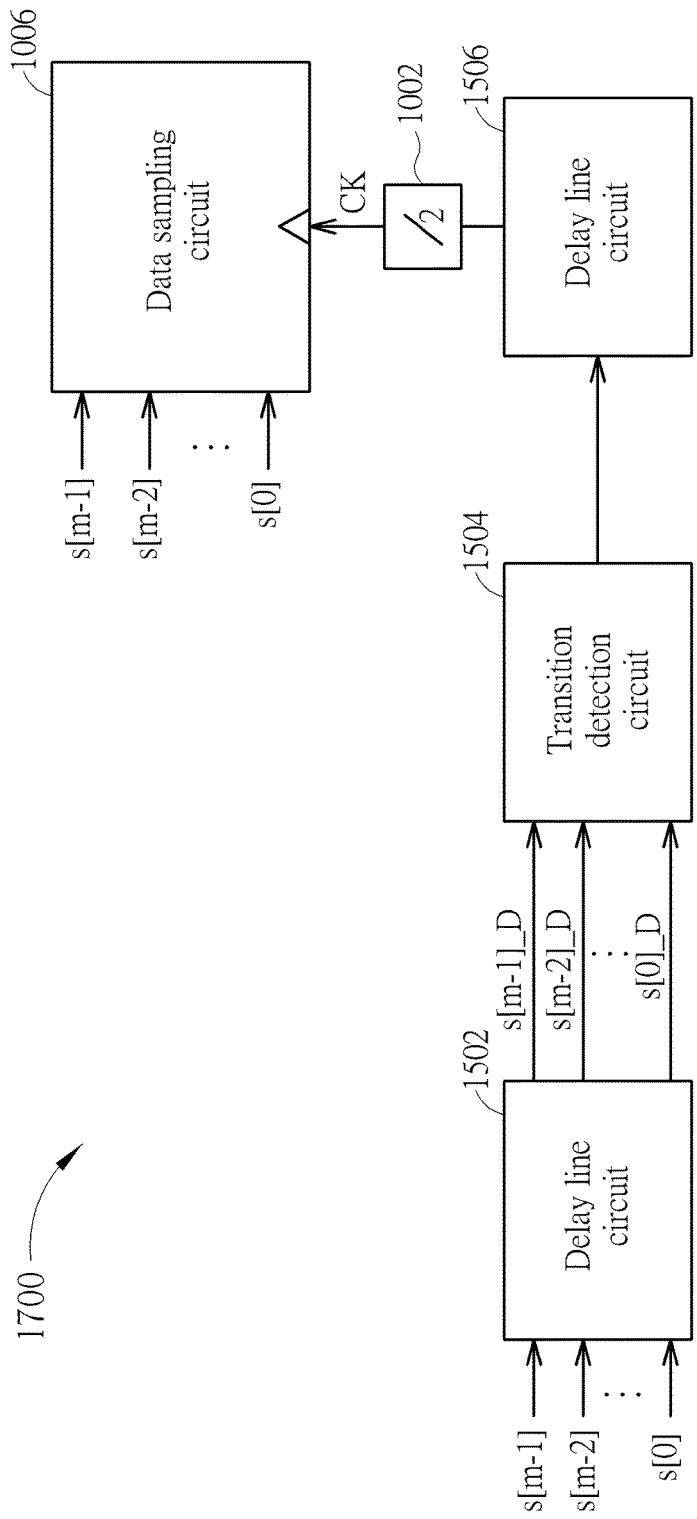
FIG. 17 is a diagram illustrating a TEC receiver according to an eighth embodiment of the present invention.

FIG. 17 is a diagram illustrating a TEC receiver according to an eighth embodiment of the present invention. In this embodiment, the data sampling function may be implemented using the data sampling circuit 1006 shown in FIG. 10, and the frequency divider (e.g., divide-by-2 counter) 1002 may be located between the delay line circuit 1506 and the data sampling circuit 1006. Hence, after the delay line circuit 1506 generates the delayed signal according to the output of the transition detection circuit 1504, the frequency divider 1002 generates the clock signal CK according to the delayed signal. Hence, the data samplers $1008_0$-$1008_{m-1}$ in the data sampling circuit 1006 are arranged to sample the vector signals s[0]-s[m−1] according to a rising edge of the clock signal CK, respectively, and the data samples $1009_0$-$1009_{m-1}$ in the data sampling circuit 1006 are arranged to sample the vector signals s[0]-s[m−1] according to a falling edge of the clock signal CK, respectively.

As illustrated in FIG. 2, the data bits transmitted via the vector signals s[2], s[1] and s[0] can be correctly recovered by the sampling timing determined directly based on a delayed version of the last transition detected between adjacent states of the vector signals s[2], s[1] and s[0]. However, the delayed last transition is unable to obtain a sampling result of the beginning state of the vector signals s[2], s[1] and s[0]. With regard to a TEC receiver employing the concept illustrated in FIG. 2, a data sampling circuit may be arranged to output a pre-defined bit pattern as a sampling result of the beginning state of the vector signals. That is, the TEC algorithm employed by the transmitter side may enforce the beginning state of the vector signals to have the pre-defined bit pattern, thus allowing the beginning state of the vector signals to be correctly reproduced at the receiver side using the same TEC algorithm.

As illustrated in FIG. 3, the data transmitted via the vector signals s[2], s[1] and s[0] can be correctly recovered by the sampling timing determined directly based on an advanced version of the first transition detected between adjacent states of the vector signals s[2], s[1] and s[0]. However, the advanced first transition is unable to obtain a sampling result of the ending state of the vector signals s[2], s[1] and s[0]. With regard to a TEC receiver employing the concept illustrated in FIG. 3, a data sampling circuit may be arranged to output a pre-defined bit pattern as a sampling result of the ending state of vector signals. That is, the TEC algorithm employed by the transmitter may enforce the ending state of the vector signals to have the pre-defined bit pattern, thus allowing the ending state of the vector signals to be correctly reproduced at the receiver side using the same TEC algorithm.

Figure 18:
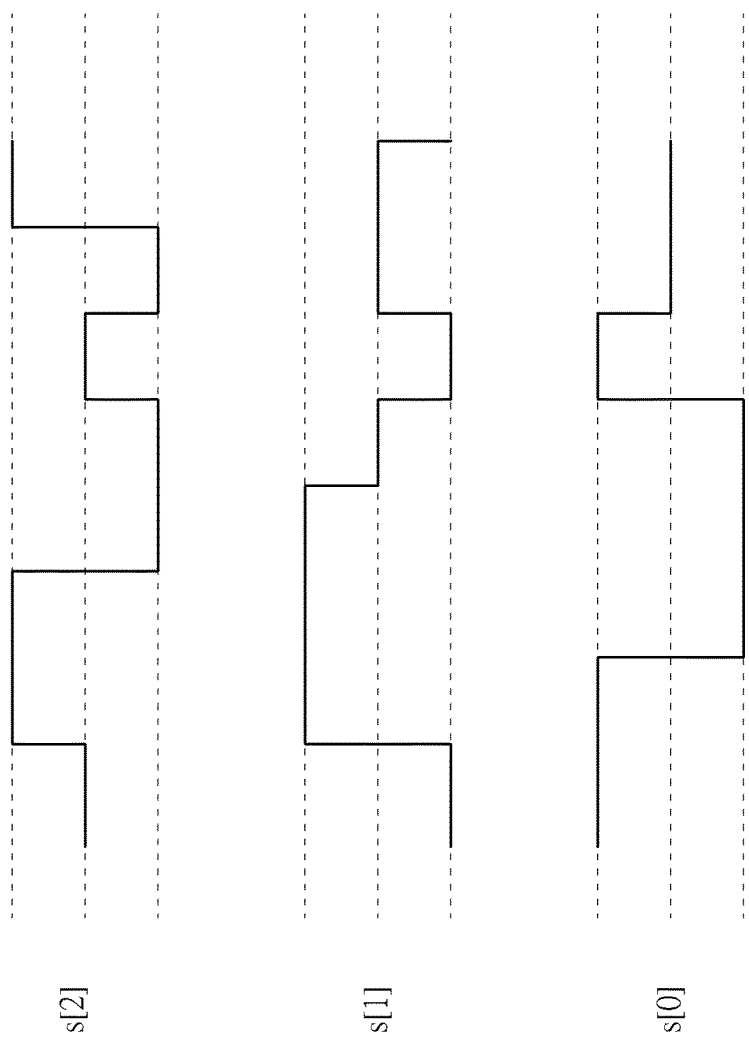
FIG. 18 is a diagram illustrating multi-level vector signals according to an embodiment of the present invention.

In above embodiments, each of the vector signals s[m−1]-s[0] may be a voltage signal having binary voltage levels to represent logic-0 or logic-1. Alternatively, each of the vector signals s[m−1]-s[0] may be a multi-level signal such as a voltage signal with more than two voltage levels. FIG. 18 is a diagram illustrating multi-level vector signals according to an embodiment of the present invention. The vector signals implemented using multi-level signals may achieve the transition enforcing coding in an analog domain (i.e., a voltage domain). For example, the encoder 112 and the decoder 124 may be omitted, and each bit in the binary data b[n−1:0] can be transition enforcing encoded/decoded by using a particular combination of voltage levels possessed by the multi-level signals.

Figure 19:
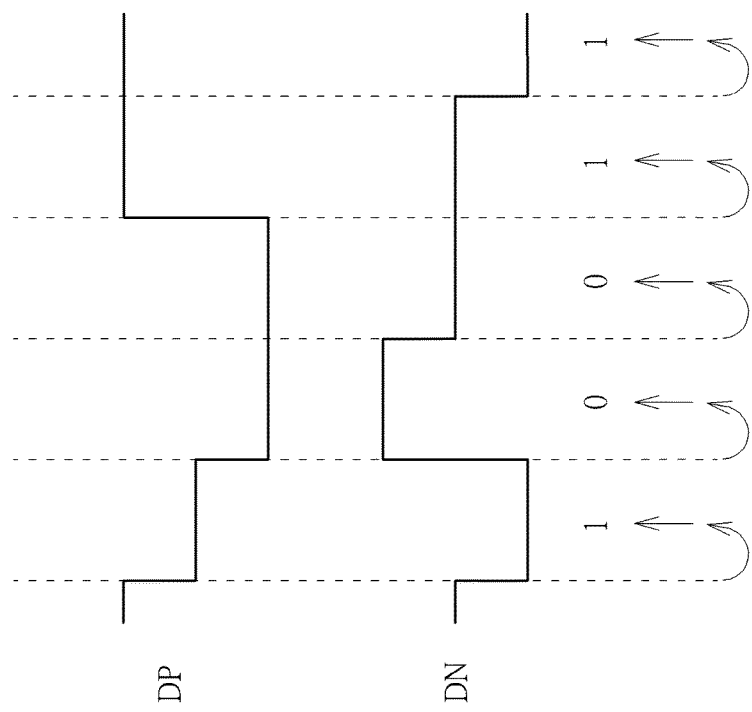
FIG. 19 is a diagram illustrating level transitions defined by multi-level signals transmitted via differential pins according to an embodiment of the present invention.

Moreover, the multi-level vector signals may be used for reducing the pin count of a transmission interface and/or carrying more information. For example, the multi-level can be used in differential pins DP and DN to define a level transition, as illustrated in FIG. 19.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transition enforcing coding (TEC) receiver comprising:
 a first delay line circuit, arranged to delay a plurality of vector signals to generate a plurality of delayed vector signals, respectively;
 a transition detection circuit, arranged to detect a transition of at least one specific delayed vector signal among the delayed vector signals; and
 a data sampling circuit, arranged to sample the vector signals according to a sampling timing determined based on an output of the transition detection circuit;
 wherein the TEC receiver determines the sampling timing without using clock and data recovery (CDR).

2. The TEC receiver of claim 1, wherein the transition of the at least one specific delayed vector signal is a last transition detected between adjacent states of the delayed vector signals.

3. The TEC receiver of claim 1, further comprising:
 a second delay line circuit, arranged to generate a delayed signal according to the output of the transition detection circuit;
 wherein the sampling timing is determined based on the delayed signal.

4. The TEC receiver of claim 3, wherein the first delay line circuit is arranged to act as a de-skew circuit.

5. The TEC receiver of claim 1, wherein the data sampling circuit is further arranged to output a pre-defined bit pattern as a sampling result of a beginning state of the vector signals.

6. The TEC receiver of claim 1, wherein each of the vector signals is a multi-level signal with more than two voltage levels.

7. A transition enforcing coding (TEC) receiver comprising:
 a first delay line circuit, arranged to delay a plurality of vector signals to generate a plurality of delayed vector signals, respectively;

a transition detection circuit, arranged to detect a transition of at least one specific delayed vector signal among the delayed vector signals;
a data sampling circuit, arranged to sample the vector signals according to a sampling timing;
a second delay line circuit, arranged to generate a delayed signal according to an output of the transition detection circuit, wherein the sampling timing is determined based on the delayed signal; and
a frequency divider, arranged to perform frequency division upon the output of the transition detection circuit to generate a clock signal to the second delay line circuit;
wherein the second delay line circuit delays the clock signal to generate a delayed clock signal as the delayed signal, and the data sampling circuit comprises:
a plurality of first data samplers, arranged to sample the vector signals according to a rising edge of the delayed clock signal, respectively; and
a plurality of second data samples, arranged to sample the vector signals according to a falling edge of the delayed clock signal, respectively.

8. A transition enforcing coding (TEC) receiver comprising:
a first delay line circuit, arranged to delay a plurality of vector signals to generate a plurality of delayed vector signals, respectively;
a transition detection circuit, arranged to detect a transition of at least one specific delayed vector signal among the delayed vector signals;
a data sampling circuit, arranged to sample the vector signals according to a sampling timing;
a second delay line circuit, arranged to generate a delayed signal according to an output of the transition detection circuit, wherein the sampling timing is determined based on the delayed signal; and
a frequency divider, arranged to perform frequency division upon the delayed signal generated from delaying the output of the transition detection circuit for generating a clock signal to the data sampling circuit;
wherein the data sampling circuit comprises:
a plurality of first data samplers, arranged to sample the vector signals according to a rising edge of the clock signal, respectively; and
a plurality of second data samples, arranged to sample the vector signals according to a falling edge of the clock signal, respectively.

9. A transition enforcing coding (TEC) receiver comprising:
a first delay line circuit, arranged to delay a plurality of vector signals to generate a plurality of delayed vector signals, respectively;
a transition detection circuit, arranged to detect a transition of at least one specific delayed vector signal among the delayed vector signals;
a data sampling circuit, arranged to sample the vector signals according to a sampling timing determined based on an output of the transition detection circuit; and
a frequency divider, arranged to perform frequency division upon the output of the transition detection circuit to generate a clock signal to the data sampling circuit;
wherein the data sampling circuit comprises:
a plurality of first data samplers, arranged to sample the vector signals according to a rising edge of the clock signal, respectively; and
a plurality of second data samples, arranged to sample the vector signals according to a falling edge of the clock signal, respectively.

10. A transition enforcing coding (TEC) receiver comprising:
a transition detection circuit, arranged to detect a transition of at least one specific vector signal among a plurality of vector signals;
a delay line circuit, arranged to generate a delayed signal according to an output of the transition detection circuit; and
a data sampling circuit, arranged to sample the vector signals according to a sampling timing determined based on the delayed signal;
wherein the TEC receiver determines the sampling timing without using clock and data recovery (CDR).

11. The TEC receiver of claim 10, wherein the transition of the at least one specific vector signal is a last transition detected between adjacent states of the vector signals.

12. The TEC receiver of claim 10, wherein the data sampling circuit is further arranged to output a pre-defined bit pattern as a sampling result of a beginning state of the vector signals.

13. The TEC receiver of claim 10, wherein each of the vector signals is a multi-level signal with more than two voltage levels.

14. A transition enforcing coding (TEC) receiver comprising:
a transition detection circuit, arranged to detect a transition of at least one specific vector signal among a plurality of vector signals;
a delay line circuit, arranged to generate a delayed signal according to an output of the transition detection circuit;
a data sampling circuit, arranged to sample the vector signals according to a sampling timing determined based on the delayed signal; and
a frequency divider, arranged to perform frequency division upon the output of the transition detection circuit to generate a clock signal to the delay line circuit;
wherein the delay line circuit delays the clock signal to generate a delayed clock signal as the delayed signal; and the data sampling circuit comprises:
a plurality of first data samplers, arranged to sample the vector signals according to a rising edge of the delayed clock signal, respectively; and
a plurality of second data samples, arranged to sample the vector signals according to a falling edge of the delayed clock signal, respectively.

15. A transition enforcing coding (TEC) receiver comprising:
a transition detection circuit, arranged to detect a transition of at least one specific vector signal among a plurality of vector signals;
a delay line circuit, arranged to generate a delayed signal according to an output of the transition detection circuit;
a data sampling circuit, arranged to sample the vector signals according to a sampling timing determined based on the delayed signal; and
a frequency divider, arranged to perform frequency division upon the delayed signal generated from delaying the output of the transition detection circuit for generating a clock signal to the data sampling circuit;

wherein the data sampling circuit comprises:
a plurality of first data samplers, arranged to sample the vector signals according to a rising edge of the clock signal, respectively; and
a plurality of second data samples, arranged to sample the vector signals according to a falling edge of the clock signal, respectively.

16. A transition enforcing coding (TEC) receiver comprising:
a delay line circuit, arranged to delay a plurality of vector signals to generate a plurality of delayed vector signals, respectively;
a transition detection circuit, arranged to detect a transition of at least one specific vector signal among the vector signals; and
a data sampling circuit, arranged to sample the delayed vector signals according to a sampling timing determined based on an output of the transition detection circuit;
wherein the TEC receiver determines the sampling timing without using clock and data recovery (CDR).

17. The TEC receiver of claim 16, wherein the transition of the at least one specific vector signal is a first transition detected between adjacent states of the vector signals.

18. The TEC receiver of claim 16, wherein the data sampling circuit is further arranged to output a pre-defined bit pattern as a sampling result of an ending state of the vector signals.

19. The TEC receiver of claim 16, wherein each of the vector signals is a multi-level signal with more than two voltage levels.

20. A transition enforcing coding (TEC) receiver comprising:
a delay line circuit, arranged to delay a plurality of vector signals to generate a plurality of delayed vector signals, respectively;
a transition detection circuit, arranged to detect a transition of at least one specific vector signal among the vector signals;
a data sampling circuit, arranged to sample the delayed vector signals according to a sampling timing determined based on an output of the transition detection circuit; and
a frequency divider, arranged to perform frequency division upon the output of the transition detection circuit to generate a clock signal to the data sampling circuit;
wherein the data sampling circuit comprises:
a plurality of first data samplers, arranged to sample the delayed vector signals according to a rising edge of the clock signal, respectively; and
a plurality of second data samples, arranged to sample the delayed vector signals according to a falling edge of the clock signal, respectively.

* * * * *